United States Patent [19]

Jamal et al.

[11] Patent Number: 5,533,067
[45] Date of Patent: Jul. 2, 1996

[54] METHOD AND DEVICE FOR ESTIMATING TRANSMITTED SIGNALS IN A RECEIVER IN DIGITAL SIGNAL TRANSMISSION OPERATIONS

[75] Inventors: Karim Jamal, Stockholm; Björn Gudmundson, Sollentuna; Gustav Brismark, Stockholm, all of Sweden

[73] Assignee: Telefonaktiebolaget LM Ericsson, Stockholm, Sweden

[21] Appl. No.: 264,491

[22] Filed: Jun. 23, 1994

[30] Foreign Application Priority Data

Jun. 24, 1993 [SE] Sweden ................................ 9302204

[51] Int. Cl.$^6$ .............................. H04L 27/06; H03H 7/30
[52] U.S. Cl. .......................... 375/341; 375/232; 375/343
[58] Field of Search .............................. 375/39, 94, 100, 375/96, 261, 340, 341, 347, 343, 329, 332, 279, 232, 230, 83, 86, 52, 53, 97, 11, 14, 12, 280, 229; 371/43; 455/137; 364/724.19, 724.20

[56] References Cited

U.S. PATENT DOCUMENTS

| 5,164,961 | 11/1992 | Gudmundson | 375/11 |
|---|---|---|---|
| 5,199,047 | 3/1993 | Koch | 375/13 |
| 5,202,903 | 4/1993 | Okanoue | 375/100 |
| 5,204,878 | 4/1993 | Larsson | 375/94 |
| 5,228,057 | 7/1993 | Larsson | 375/14 |
| 5,319,677 | 6/1994 | Kim | 375/100 |

FOREIGN PATENT DOCUMENTS

| 520969 | 12/1992 | European Pat. Off. . |
|---|---|---|
| WO90/16118 | 12/1990 | WIPO . |
| WO92/11708 | 7/1992 | WIPO . |

OTHER PUBLICATIONS

E. Dahlman, "A Study of Adaptive Detectors for Fast–Varying Mobile–Radio Channels," Report No. TRITA-TTT-9213, Section 5, Royal Institute of Technology (Oct. 19, 1992).

G. D. Forney, Jr., "The Viterbi Algorthm," *Proc. of the IEEE,* vol. 61, No. 3, pp. 268–278 (Mar. 1973).

R. A. Iltis, "A Bayesian Maximum–Likelihood Sequence Estimation Algorithm for A–Priori Unknown Channels and Symbol Timing," Depertent of Electrical and Computer Engineering, University of California, Santa Barbara (Aug. 21, 1990).

L. Lindbom, "Adaptive Equalization for Fading Mobile Radio Channels,"Chap. 4, Rpt. No. UPTEC 92124R, Institute of Technlogy, Uppsala University (Nov. 1992).

F. R. Magee, Jr. et al., "Adaptive Maximum–Likelihood Sequence Estimation for Digital Signaling in the Presence of Intersymbol Interference,"*IEEE Trans. on Information Theory,* pp. 120–124 (Jan. 1973).

K. Okanoue et al., "New MLSE Receiver Free From Sample Timing and Input Level Controls," 43rd IEEE Vehicular Technology Conf., pp. 408–411 (May 18–20, 1993).

S. U. H. Qureshi, "Adaptive Equilization," *Proc. of the IEEE* vol. 73, No. 9, pp. 1370–1372 (Sep. 1985).

G. Ungerboeck, "Adaptive Maxmum–Likelihood Receiver for Carrier–Modulated data–Transmission Systems," *IEEE Trans. on Communications,* vol. COM-22, No. 5, pp. 624–636 (May 1974).

Y. Wan et al., "Fractionally–Spaced Maximum–likelihood Sequence Estimation Receiver in a Multipath Fading Environment," *Proc. of the IEEE,* ICASSP, pp. 689–692 (1992).

*Primary Examiner*—Stephen Chin
*Assistant Examiner*—Tesfaldet Bocure
*Attorney, Agent, or Firm*—Burns, Doane, Swecker & Mathis

[57] ABSTRACT

In a digital signal transmission system, a receiver receives a signal, wherein the signal bandwidth of the system exceeds the system symbol rate. A correlation and sampling circuit receives a baseband signal, samples the signal eight times per symbol time, correlates, generates a channel estimate and down-samples the sampled signal to form an observed signal. This signal is filtered in a prefilter, whose output is sampled at symbol rate and the obtained signal is delivered to a channel equalizer which performs a viterbi algorithm with non-quadratic metric calculation and generates estimated symbols. A channel estimation filter receives a symbol sequence which contains alternate zero-value symbols and the estimated symbols and generates an estimated signal. An error signal is generated and used to adapt the channel estimate and also to generate weight factors. The coefficients of the prefilter are generated as a function of the channel estimate and the weight factors. Coefficients are generated in a metric calculation filter, by convolving the channel estimate with the prefilter and are used to generate the estimated symbols. The transmission channel, excluding the prefilter, is estimated explicitly so as to enable fast channel changes to be followed. The use of the weight factors enables a short channel estimate to be used. The insertion of the zero-value symbols simplifies adaptation of the channel estimate.

22 Claims, 7 Drawing Sheets

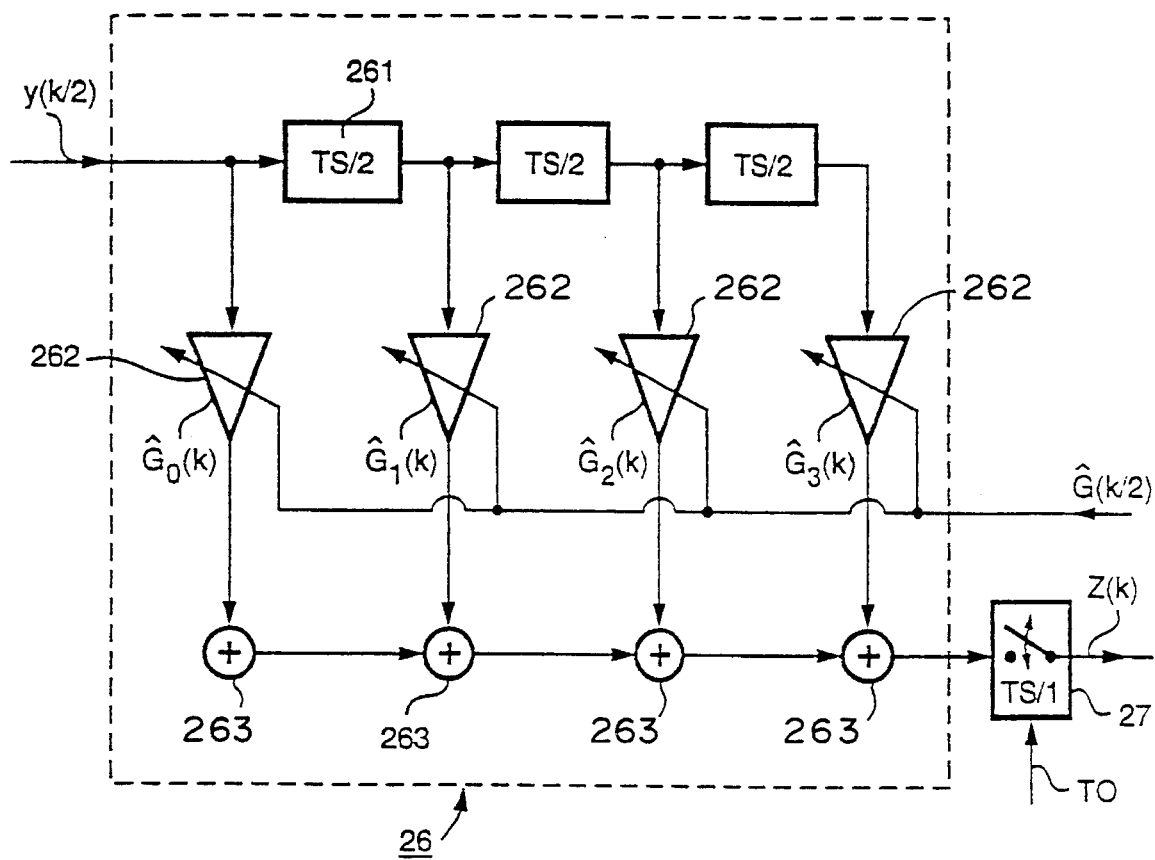
FIG. 7
FIG. 8
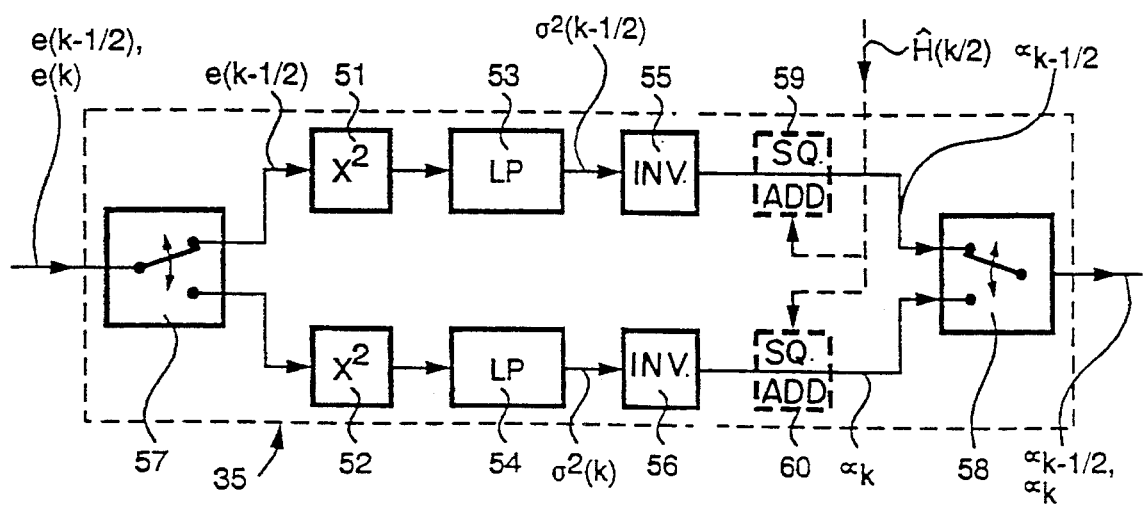

METHOD AND DEVICE FOR ESTIMATING TRANSMITTED SIGNALS IN A RECEIVER IN DIGITAL SIGNAL TRANSMISSION OPERATIONS

BACKGROUND

The present invention relates to a method in digital signal transmission over a channel for estimating in a receiver transmitted symbols from a transmitted radio signal, wherein the symbol estimation is effected in a channel equalizer in accordance with a selected viterbi algorithm, and wherein the method comprises the following method steps:

receiving and demodulating the transmitted signal to a received signal;

sampling the received signal at at least one sampling time point per symbol;

determining at least an initial value of the estimated channel impulse response, the channel estimate, with the aid of the sampled signal values;

determining a symbol sampling time point;

selecting filter coefficients of a prefilter and filtering the sampled signal values in the prefilter to obtain prefiltered, observed signal values; and generating at least preliminarily estimated symbols in accordance with the viterbi algorithm, with the aid of the prefiltered, observed signal values.

The invention also relates to an arrangement for carrying out the method.

One problem which often occurs in the digital radio transmission of a signal over a channel is that a transmitted signal is subjected to noise and co-channel disturbance and also to multipath propagation which results in time dispersion. For instance, in the case of mobile telephony, the transmission properties of the radio channel shift as a result of the transmitter and receiver changing their mutual relative positions. These problems have been solved in time-shared digital radio transmission systems in that the signal sequences that are transmitted in a time slot have one or more synchronizing sequences and one or more data sequences. The synchronizing sequence is known to the receiver and the receiver is able to estimate the transmission properties of the channel, i.e. to make a channel estimate, with the aid of this sequence. The receiver estimates the symbols of the data sequence containing the information that is to be transmitted, with the aid of this channel estimate.

In certain cases, it is not sufficient to make a channel estimate only once with each time slot. In the case of long time slots, the transmitter and the receiver have time to change their mutual relative positions considerably within the duration of the time slot. This means that the transmission properties of the channel can also change considerably within the duration of the time slot, so that the estimation of the transmitted symbols made by the receiver will be deficient and the transmitted information therefore unclear or ambiguous. A radio receiver in which such disturbances are partially avoided is described in an article in IEEE Transactions on Information Theory, January 1973, pages 120–124, F. R. Magee, Jr. and J. G. Proakis: "Adaptive Maximum-Likelihood Sequence Estimation for Digital Signaling in the presence of Intersymbol Interference". The article describes a channel equalizer which includes a viterbi analyzer having an adaptive filter as a channel estimating circuit. Received symbols are compared successively with hypothetical symbols and those hypothetical symbols which coincide closest with the received symbols are selected successively to form an estimated symbol sequence. The parameters of the adaptive filter are adjusted successively to the changed channel, with the aid of the selected, decided symbols.

A description of the viterbi algorithm is given in an article by G. David Forney, Jr.: "The Viterbi Algorithm" in Proceedings of the IEEE, Vol. 61, No. 3, March 1973. The article also describes in some detail the state and state transitions of the viterbi algorithm and also how these state transitions are chosen so as to obtain the most probable sequence of symbols.

The signal transmission between transmitter and receiver may be connected with certain problems, despite performing sequence estimation and adaptive channel estimation in the aforedescribed manner. One reason for these deficiencies is that the signal bandwidth of the system exceeds the system symbol rate, so-called excess bandwidth, as is the case, for instance, in the North American mobile telephone system TIA IS-54. Another reason for these deficiencies is that the transmission properties of the channel can change quickly, for instance as a result of fading. Two different types of solution to the problem of symbol rate are known to the art, in which a MLSE-detector (Maximum-Likelihood Sequence Estimator) is used:

The viterbi algorithm itself operates at a higher rate than the symbol rate.

An adaptive, fractionally spaced prefilter is used prior to the viterbi analyzer.

The first type of solution is described in an article by Yongbing Wan, et al, of NovAtel Communications Ltd.: "A Fractionally-Spaced Maximum-Likelihood Sequence Estimation Receiver in a Multipath Fading Environment" published in the Proceedings of IEEE, ICASSP 1992. According to this article, a received radio signal is sampled twice with each symbol and the channel estimation is effected with the aid of an adaptive filter that uses this double sampling rate. The symbol estimate is performed in a viterbi analyzer which also uses the double sampling rate. The delta metric values, i.e. deviations between the received and the hypothetical sequences, are calculated for both the sampling occasions per symbol and the two delta metric values are added to determine a best state transition according to the viterbi algorithm. When adapting the filter with the aid of the estimated symbols, a fictive symbol is inserted at each alternate sampling time point. These fictive symbols are produced by interpolation between the estimated symbols in a second filter. The proposed solution has certain drawbacks. It is necessary to sample the received symbols at highly specific time points, and the adaptive channel estimation is complex. The interpolation in the second filter results in delays which may impair the symbol estimation. Filters that are used in signal processing, for instance a transmitter filter or a receiver filter must be known filters. Receiver filters, which may contain coils and capacitors, cause particular problems due to aging, manufacturing accuracies and temperature variations.

Another solution of the first kind is given in a paper written by R. A. Iltis: "A Bayesian Maximum-Likelihood Sequence Estimation Algorithm for A-Priori Unknown Channel and Symbol Timing" Department of Electrical and Computer Engineering, University of California, Santa Barbara, Aug. 21, 1990. This paper also states that a received signal shall be sampled twice with each symbol. Symbol estimation is effected in accordance with a viterbi algorithm, which calculates two delta metric values for each symbol, and these two values are weighted in the metric calculation. The channel estimation is performed in an adaptive filter having filter coefficients of the spacing of a symbol time, although the coefficients are adapted with each sampling occasion, thus twice with each symbol. The solution given includes a comprehensive metric calculation and because the channel estimate used has its filter taps at a full symbol time spacing, it fails to solve the problem of symbol synchronization in respect of complicated rapidly varying excess bandwidth channels. Also, similar to the solution proposed by Yongbing Wan according to the aforegoing, a receiver filter must be known with high degree of accuracy in the receiver.

The aforesaid methods relating to the first type of problem solution for solving the problem of low symbol rate are relatively demanding with regard to the calculations that must be carried out. A method which relates to the second type of solution has been proposed in an article in IEEE Transactions on Communications, Vol. Com-22, No. 5, May 1974, written by G. Ungerboeck: "Adaptive Maximum-Likelihood Receiver for Carrier-Modulated Data-Transmission Systems". According to this article, a received radio signal is sampled several times with each symbol time and the sample signal is allowed to pass through a prefilter. The prefiltered signal is sampled down to symbol rate and is then processed in a viterbi analyzer, which produces estimated symbols. The sampled impulse response of the radio channel is estimated with the aid of a channel estimate, this response including both the actual channel between transmitter and receiver, transmitter filter and receiver filter and also the prefilter. The prefilter and the channel estimation filter are each adapted to the variable radio channel with the aid of the estimated symbols obtained from the viterbi analyzer. This analyzer uses the filter coefficients in the channel estimation filter to perform symbol estimation, in a known manner. The metric calculation in the viterbi analyzer is non-quadratic and is simplified in comparison with the quadratic metric calculation normally used. This non-quadratic metric calculation can be used because the received signal has been filtered in the prefilter. The simplified method defined in the Ungerboeck article requires certain restrictions in the adaptation algorithm, as illustrated in an article in Proceedings of the IEEE, Vol. 73, No. 9, September 1985, pages 1370–1372 by S.U.H. Qureshi: "Adaptive Equalization". The restrictions are required because the channel estimation filter and the prefilter are each separately adapted with the aid of the estimated symbols. This can result in all of the coefficients in the two filters converging towards zero. The restrictions are introduced with the intention of counteracting this convergence, these restrictions, for instance, comprising assigning a fixed value to one of the coefficients in the channel estimation filter. On the other hand, these restrictions render the simplified method less suited for use with fast varying channels, for instance fast fading channels. The problem that occurs resides in the lack of time in which to achieve this adaptation and, in principle, the same sort of problem of following the channel behaviour occurs as that occurring in a linear or a DFE-equalizer (Decision Feed Back). Expressed in simple terms, this means that an attempt is made to follow the inverted impulse response of the channel rather than the actual channel impulse response itself, and it is well known that the channel has, in general, a much slower changing rate than its inverse.

The second of the aforesaid problems, the fading problem, has earlier been solved, as described for instance in Swedish Patent Application SE 9102612-0, which corresponds to U.S. patent application Ser. No. 07/942,270 filed Sep. 9, 1992. A complex value signal is transmitted between transmitter and receiver and the signal strength of the signal varies very quickly and has abrupt fading dips. According to this patent application, it is observed that the real and imaginary components of the signal each vary relatively regularly and that the time derivatives of these components are often almost linear. This is utilized to estimate both the radio channel impulse response and the derivative of the impulse response. This derivative estimate is used to estimate the impulse response after a fading dip, during which the radio signal has been practically extinguished. A similar method is described in a dissertation by Lars Lindblom: "Adaptive Equalization for Fading Mobile Radio Channels", System and Control Group, Department of Technology, Uppsala University, 1992.

SUMMARY

The present invention relates to a method and to an arrangement for symbol estimation in digital signal transmission over a channel. Those problems which occur when the digital transmission system has a signal bandwidth which exceeds the symbol rate of the system, referred to as "excess bandwidth", are solved by one aspect of the invention. Those problems which occur in the case of rapidly varying channels, for instance rapidly fading radio channels, is solved by another aspect of the invention.

The method is effected with the aid of a viterbi analyzer which utilizes the non-quadratic metric calculation according to the aforesaid article by G. Ungerboeck. A received signal is sampled several times with each symbol time and this observed, sampled signal is permitted to pass through a fractionally sampled prefilter. The prefiltered signal is sampled down to symbol rate and is applied to the viterbi analyzer. The viterbi analyzer performs the symbol estimation at symbol rate and produces estimated symbols. A system impulse response, including transmission channel and transmitter filter and receiver filter, but excluding the prefilter, is estimated explicitly, such as a channel estimate in a channel estimation filter intended herefor. This filter is operative in generating estimated values of the received signal with the aid of the estimated symbols obtained from the viterbi analyzer. Error signals are formed as a difference between the estimated signals and the observed, sampled signals. The prefilter is generated essentially as a time-inverted and complex-conjugated version of the channel estimate. However, the prefilter coefficients are weighted with the aid of weight factors which, according to one advantageous embodiment of the invention, are generated in dependence on the inverted values of the error signals. This enables a short channel estimate containing relatively few coefficients to be used. As before mentioned, the prefilter is fractionally sampled and consequently it is also necessary to fractionally sample the channel estimate. In order to enable the simplified metric calculation to be carried out in the viterbi analyzer, coefficients in a metric calculating filter are generated. This filter includes generally a convolution between the channel estimate and the prefilter and is thereafter sampled at symbol rate.

As before mentioned, the estimated values of the received symbols and the error signal are generated with the aid of the determined symbols obtained from the viterbi analyzer. According to the aforegoing, the symbols received upstream of the prefilter are sampled several times with each symbol time and fictive symbols are inserted into the sequence of determined symbols at these intermediate sampling time points, to enable the error signals to be generated at the sampling time points between the symbols. The fictive symbols are assigned zero-values. This means that all transmitter and receiver filters will be included in the channel estimate and that these filters need not therefore be known to the receiver. Another result of introducing the zero-value symbols is that the channel estimation becomes much less complex.

It is often necessary to adapt the estimated impulse response of the channel, the channel estimate, for instance in the case of long time slots or a rapidly changing channel. The error signals and an appropriate adaptation algorithm are used in this regard. This adaptation, which is made several times with each symbol time, is considerably simplified by inserting the zero-value symbols. In this way, new coefficient values in the filter need only be generated once with each symbol, irrespective of the number of sampling time points per symbol. By inserting the fictive symbols of zero-value instead of using further interpolation filters to generate the fictive symbols, it is also possible to use a relatively short channel estimate. This results in relatively short delays when adapting the channel estimate, which also contributes to enabling the symbols to be estimated with a high degree of accuracy in the viterbi analyzer.

A predictor can be used to advantage in an adaptive viterbi detector when generating the prefilter and the metric calculation filter. This enables some compensation to be made for the delayed channel estimate that results from the decision delay in the viterbi analyzer. According to one embodiment of the present invention, different coefficients of the prefilter are also predicted for different future time periods. This is advantageous when a non-quadratic viterbi analyzer having a prefilter is used.

In those instances when only the problem involving the rapidly varying channel is to be solved, the second aspect of the invention, the received signal need only be sampled once with each symbol. In this regard, the channel estimate, and also the prefilter and metric calculation filter, are sampled only once with each symbol. As in the aforegoing, the viterbi analyzer works at symbol rate.

It can be said in summary that the present invention distinguishes from the known techniques essentially in the three following respects:

The channel is estimated and tracked explicitly and the coefficients in the prefilter and the metric calculation filter are calculated with the aid of the channel estimate obtained.

The weighting factors are used when generating the prefilter and the metric calculation filter to enable a short channel estimate to be used, with little loss in performance.

Prediction times of different lengths are permitted for the coefficients in the prefilter.

The invention can be applied generally in signal transmission and particularly for rapidly fading radio channels. The receiver performance is improved considerably in comparison with known techniques, without the receiver needing to be too complex.

BRIEF DESCRIPTION OF THE DRAWINGS

An exemplifying embodiment of the invention will now be described in more detail with reference to the accompanying drawings, in which

FIG. 7 is a block schematic illustrating a prefilter;

FIG. 8 is a block schematic illustrating a weighting factor generating circuit;

DETAILED DESCRIPTION

Figure 1:
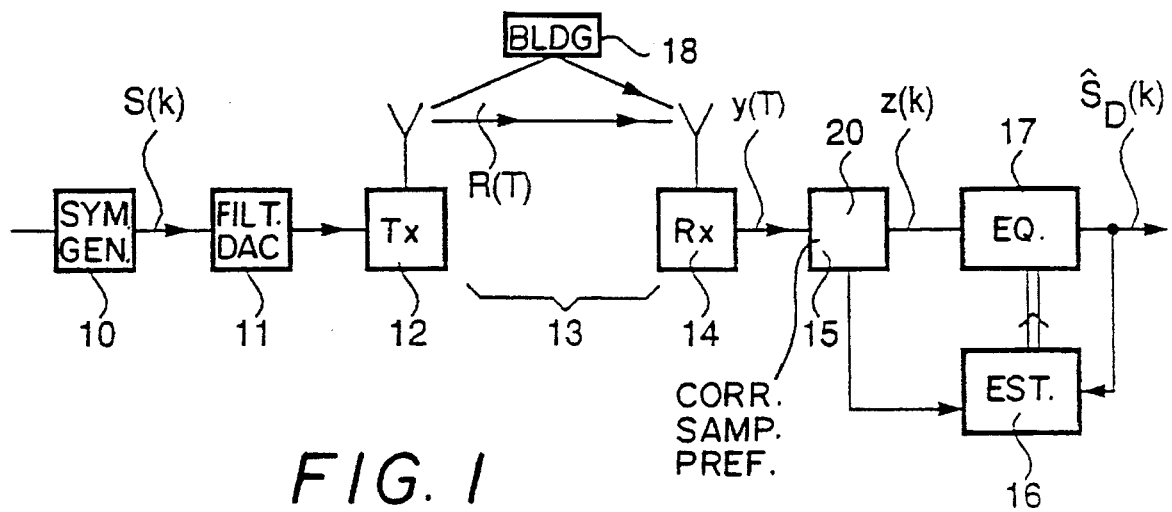
FIG. 1 is a block schematic outlining a transmitter and a receiver in a digital radio system.

FIG. 1 illustrates schematically a radio transmission system for time-shared signal transmission. A transmitter includes a unit 10 which receives an information carrying signal and generates corresponding digital symbols S(k). In the reference S(k), the letter k is an integer symbol counter. These symbols are delivered to a unit 11 which includes a transmitter filter and a digital/analogue converter. The symbols S(k) are signal processed in the unit 11 and transmitted to a radio transmitter 12, which transmits the signal made analogue in the unit 11 in the form of a signal R(T) of selected carrier frequency. The analogued signal is transmitted over a radio channel 13 to a receiver equipped with a radio receiver 14. The channel 13 subjects the signal R(T) to multipath propagation among other things, as indicated in the Figure by double signal paths. The signals travelling along one signal path are reflected against, for instance, a building 18 prior to reaching the receiver. The radio receiver 14 demodulates the received signal to baseband and delivers a baseband signal y(T) to a correlating and sampling circuit 15. In turn, the circuit delivers an observed sampled signal referenced y(2). The signal y(k/2) is received by a prefilter circuit 20 which delivers a prefiltered, observed signal z(k) to a channel equalizer 17. The signal z(k) is processed in the channel equalizer 17 in accordance with a viterbi algorithm and the equalizer delivers estimated symbols $\hat{S}_D(k)$, which shall coincide as near as possible to the symbols S(k) of the transmitter. The viterbi algorithm uses a simplified non-quadratic metric calculation according to the aforesaid reference G. Ungerboeck. The correlating and sampling circuit 15 is connected to a channel estimation circuit 16 and delivers thereto the initial values of a channel estimate which includes the channel 13. According to this embodiment, the circuit 16 is adaptive and generates successively new coefficient values for the channel estimate, which is hereby adapted successively to the time-varying channel 13 with the aid of the signal y(k/2) and the estimated symbols $\hat{S}_D(k)$. In addition to the channel estimate, there are also generated in the channel estimation circuit 16 the coefficient values of the prefilter circuit 20 and the coefficient values of a metric calculation filter that is used by the viterbi algorithm in the channel equalizer 17 when estimating the symbols $\hat{S}_D(k)$. It can be said generally that it is the filters in the channel estimation circuit 16 and the generation of its filter coefficients that are the subject of the invention, as will be described in more detail further on.

It should be noted that, for instance, the estimated symbols $\hat{S}_D(k)$ are delayed in relation to the observed signals $z(k)$, despite the fact that the same symbol counter (k) is given. This reference method is used throughout the following description for the sake of simplicity and it will be understood that the person skilled in this art will realize that certain circuits cause delays. It has only been considered necessary to state explicitly a delay of a signal in a few instances. The reference sign (k−1) thus denotes a delay comprising one symbol time.

Figure 2:
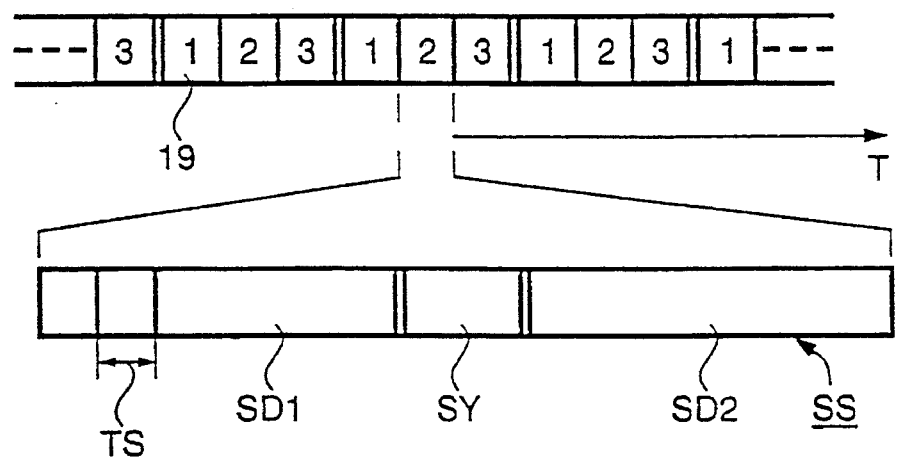
FIG. 2 illustrates time slots and a symbol sequence for time-shared radio transmission.
Figure 3:
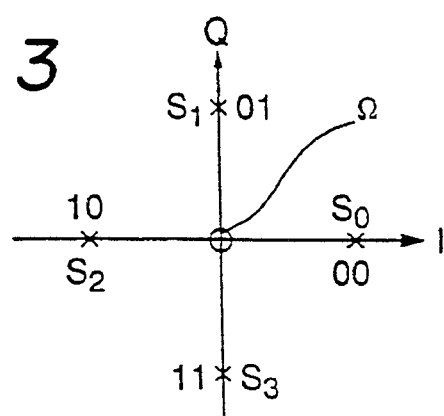
FIG. 3 illustrates a complex number plan with symbol values.

As before mentioned, the radio transmission system according to this embodiment is time-shared, as illustrated in FIG. 2, in which T denotes time. A carrier frequency, or actually a frequency-pair for two-directional communication, is divided into three time slots 19, numbered 1, 2 and 3. A symbol sequence SS which includes a synchronizing sequence SY and two data sequences SD1 and SD2 containing the information to be transmitted is transmitted in each time slot. The symbol sequence SS includes binary signals, although the aforesaid symbols S(k) are modulated in accordance, for instance, with QPSK-modulation, as illustrated in FIG. 3. In a complex number plane having coordinate axes designated I and Q, the four possible values $S_0$, $S_1$, $S_2$ and $S_3$ of the symbols S(k) are marked, as are also corresponding binary numbers 00, 01, 10 and 11. The time taken to transmit one such modulated symbol is designated one symbol time TS, as schematically shown in FIG. 2. It is these whole symbol times TS that are counted by the integer symbol counter k. The aforedescribed division into time slots and symbol modulation are known techniques and do not form any part of the inventive concept.

The system outlined in FIGS. 1 and 2 may exist in a mobile telephone system, in which the transmitter is a base station and the receiver is a mobile station, or vice versa. The three time slots 1, 2 and 3 and the signal sequence SS conform to the American mobile telephone system standard TIA/IS-54. In this system, the time slots have a time duration of 6.7 milliseconds, which in the case of the majority of situations occurring in practice require the channel estimation circuit 16 to be adaptive, as mentioned above.

As before mentioned in the introduction, problems occur in channel equalization and symbol estimation in digital signal transmission systems whose signal bandwidth B exceeds the system symbol rate R=1/TS. This is the case, for instance, in the abovementioned American mobile telephone system, whose signal bandwidth is B=30 kHz and whose symbol rate R=24.3 kBd. According to the sampling theorem, it is practically never sufficient to sample the baseband signal y(T) at the symbol rate R in systems such as these. However, the symbol rate can be used for the signal processing in accordance with the viterbi algorithm in the channel equalizer 17. This is possible when the baseband signal y(T) is sampled at a higher frequency than the symbol rate R and this higher frequency is used in accordance with the invention when prefiltering in the prefilter circuit 20 and when generating filter coefficients in the channel estimation circuit 16. The use of the symbol rate in the channel equalizer 17 allows the equalizer to be relatively simple, and the invention also enables the simplified non-quadratic metric calculation for the viterbi algorithm to be used.

Figure 4:
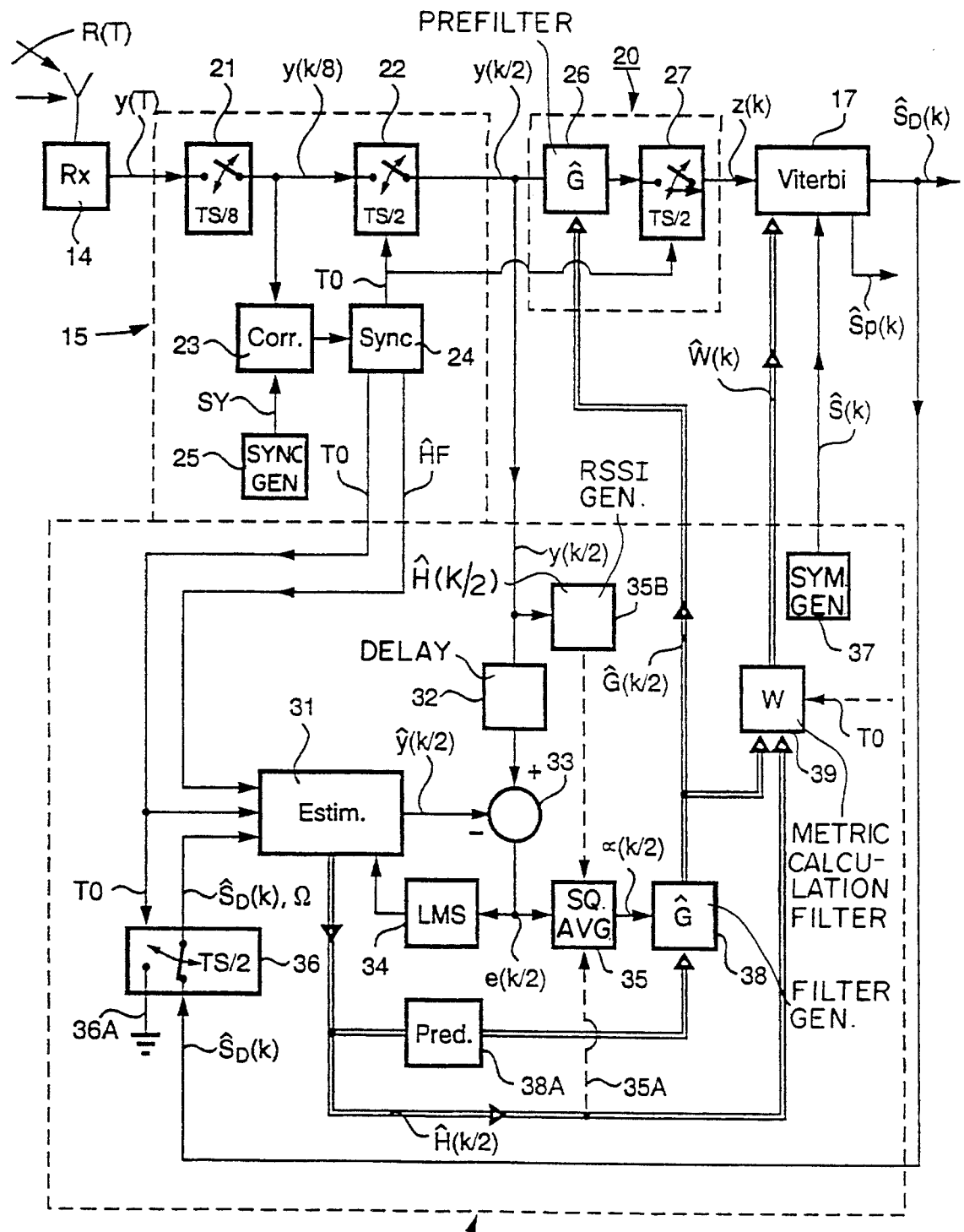
FIG. 4 is a block schematic illustrating the receiver.

The receiver shown schematically on the right half of FIG. 1 is illustrated in more detail in FIG. 4. The radio receiver 14 is connected to the correlating and sampling unit 15, which includes a first sampler 21, a second sampler 22, a correlating circuit 23, a synchronizing circuit 24 and a generator 25 for the synchronizing sequence SY known to the receiver. The first sampler 21 receives the continuous baseband signal y(T) from the radio receiver 14 and samples this signal eight times for each symbol, i.e. it has a sampling frequency of 8/TS. The thus sampled signal, referenced y(k/8), is delivered to the correlating circuit 23. A first channel estimate F for the observed symbol sequence SS is generated in this circuit with the aid of the synchronizing sequence SY from the generator 25 and the transmitted, observed synchronizing sequence. When generating this first channel estimate, there is also established a symbol sampling time point TO in the synchronizing circuit 24. This symbol sampling time point controls the second sampler 22, by which, in accordance with this example, two of the original eight sampling time points for each symbol are chosen with a time spacing of TS/2. This results in the observed signal y(k/2), which the sampling unit delivers to the prefilter circuit 20 and the channel estimation circuit 16. Down-sampling in the unit 22 is effected so as to simplify signal processing in the aforesaid channel estimation circuit. The original eight samplings are used to establish the symbol sampling time TO, which is the starting point at which symbols are counted in the aforesaid symbol counter. The symbol sampling time TO and the first channel estimate $\hat{H}F$ are delivered to the channel estimation circuit 16.

A brief description of how the channel estimate F is generated in the correlating and sampling circuit 15 will now be given. An impulse response which includes the channel 13 is generated with the aid of the signal y(k/8) and the synchronizing sequence. The impulse response extends over a time interval which includes several symbol times TS and discrete impulse response values are generated at a time spacing of TS/8. A shorter time interval containing the first channel estimate $\hat{H}F$ is selected within the aforesaid time interval. In the case of the illustrated embodiment, this choice is made so that the first channel estimate $\hat{H}F$ obtains maximum energy. Furthermore, the first channel estimate $\hat{H}F$ is given solely at points which are spaced apart by the time spacing TS/2. The Swedish Patent Application No. 8903842-6 which corresponds to U.S. Pat. No. 5,228,057 that is incorporated here by reference, describes in more detail how the channel estimate of maximum energy is chosen. However, it lies within the scope of the invention to choose the channel estimate in other known ways. It should be observed that the channel estimate, both the first channel estimate $\hat{H}F$ and the later adapted channel estimate, includes both the physical radio channel 13 and the transmitter filter 11 and the receiver filter, for instance a MF-filter. The prefilter circuit 20 is not included in the channel estimate. It should also be noted that by correlation is actually meant generally a least square estimation. In principle, an estimation of this nature coincides with a correlation when the known synchronizing sequence used has a so-called white noise autocorrelation function. This is often the case in mobile telephony systems.

The channel estimation circuit 16 includes an adaptive channel estimation filter 31, a delay circuit 32, a difference former 33, a circuit 34 which performs an adaptation algorithm, a quadrating and mean value forming circuit 35, a signal switch 36, a symbol generator 37, a filter generator 38 which includes a prediction circuit 38A, and a metric calculation filter 39. The channel estimation filter 31 receives the first channel estimate $\hat{H}F$ and the symbol sampling time point TO, and also the symbols $\hat{S}_D(k)$ estimated in the channel equalizer 17. The estimated signal values $\hat{y}(k/2)$ delivered to the difference former 33 are formed with the aid hereof. The difference former 33 also receives the observed signal y(k/2) which has been delayed in the circuit 32, and delivers an error signal e(k/2)=y(k/2)−

$\hat{y}(k/2)$. The error signal is delivered to circuit 34, which, through its adaptation algorithm, controls the adaptive filter 31. It also delivers successively adapted values $\hat{H}(k/2)$ of the channel estimate to the filter generator 38, via the prediction circuit 38A. The filter generator 38 also receives weighting factors $\alpha(k/2)=\alpha_{k-\frac{1}{2}}$, $\alpha_k$ that have been generated in the circuit 35 with the aid of the error signal e (k/2), as explained in more detail below. There is generated in the filter generator a prefilter function $\hat{G}(k/2)$ having filter coefficients which are delivered to the prefilter circuit 20 and also to the metric calculation filter 39. There is generated in this latter filter a filter function $\hat{W}(k)$ having coefficients for the simplified metric calculation according to the viterbi algorithm, and the coefficients are delivered to the channel equalizer 17. The channel equalizer 17 receives from the symbol generator 37 hypothetical symbols $\hat{S}(k)$, which assume the four symbol values $S_0$, $S_1$, $S_2$ and $S_3$ given in FIG. 3. The signal switch 36 is controlled from the synchronizing circuit 24 and shifts with a spacing of one-half symbol time, TS/2, in alternating an estimated symbol $\hat{S}_D(k)$ and a fictive symbol $\Omega$ which has a zero-value. This zero-value shall not be confused with the binary value 00 of the complexvalue symbol $S_O$ in FIG. 3. The fictive zero-value symbol $\Omega$ is in the origin of the complex number plane I-Q as shown in FIG. 3. The generating of the fictive symbol $\Omega$ has been shown schematically in the Figure by connecting one terminal 36A of the signal switch 36 to earth potential. The reason why zero-values are shifted in will be explained in more detail below with reference to FIG. 5.

The prefilter circuit 20 includes a prefilter 26 which receives the prefilter function $\hat{G}(k/2)$ from the filter generator 38. The observed signal y(k/2) passes the prefilter and is down-sampled thereafter to symbol rate in a third sampler 27, which is controlled from the synchronizing circuit 24. Down-sampling is effected at the symbol sampling time TO, so as to obtain the prefiltered, observed signal z(k), which thus occurs with one value for each symbol time TS.

Figure 5:
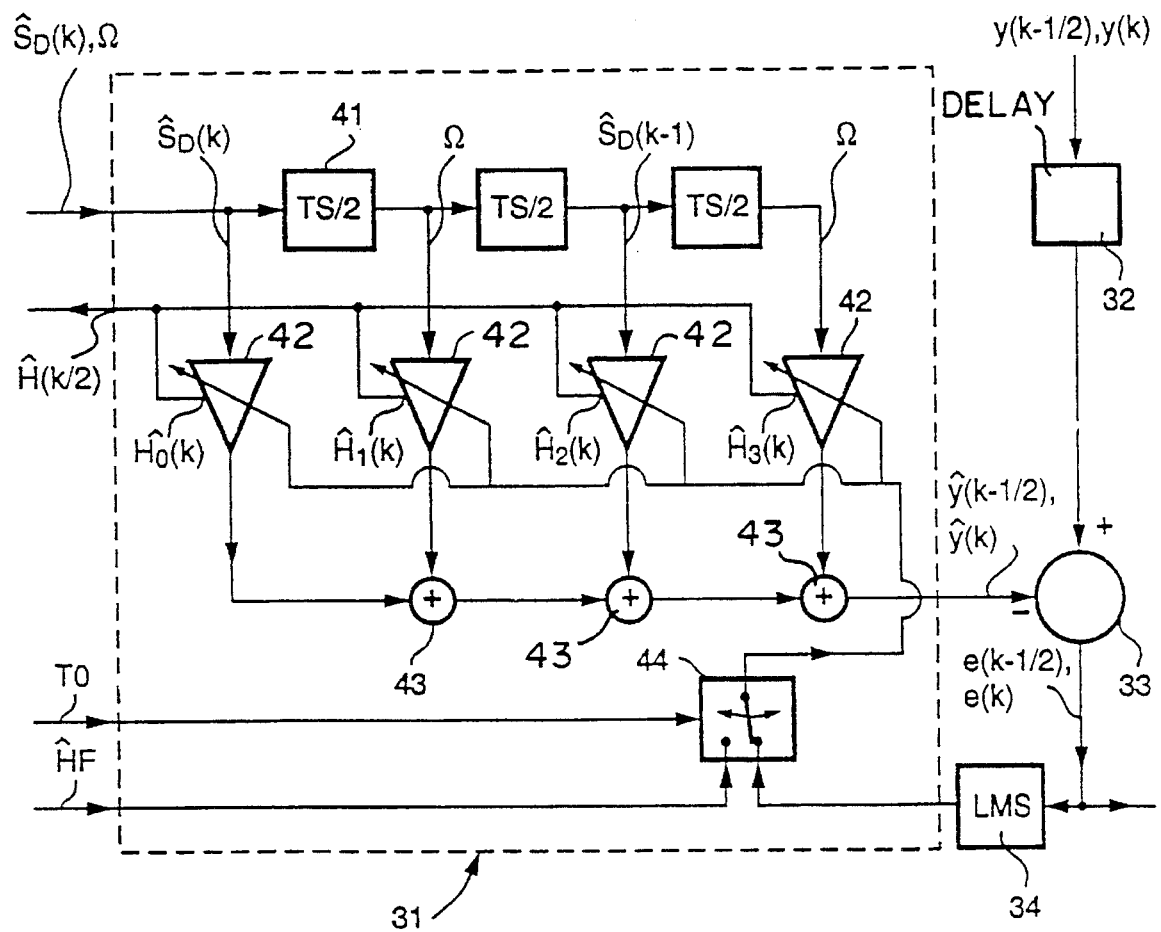
FIG. 5 is a block schematic illustrating a channel estimation filter.

FIG. 5 illustrates the channel estimation filter 31, the delay circuit 32, the difference former 33 and the circuit 34 with the adaptation algorithm. The filter 31 includes delay circuits 41, coefficient circuits 42, summators 43 and a switch 44. The delay circuits 41 are connected sequentially in series and delay the incoming signal successively by one-half symbol time TS/2. The successively delayed signals are multiplied in the coefficient circuits 42 by coefficients $\hat{H}_0(k)$, $\hat{H}_1(k)$, $\hat{H}_2(k)$ and $\hat{H}_3(k)$ which are the values of the channel estimate $\hat{H}(k/2)$ at four time points spaced by one-half symbol time TS/2. The output signals from the coefficient circuits 42 are added in the adders 43 to obtain the estimated signal values $\hat{y}(k/2)$. The error signals e(k/2) are formed in the difference former 33 and delivered to the adaptation algorithm in the circuit 34. This algorithm is chosen in dependence on the disturbances that the radio channel 13 is assumed to have and in the case of the illustrating embodiment is a so-called LMS-algorithm (Least Mean Square). The output signal from the circuit 34 adjusts the coefficients in the coefficient circuits 42, so as to minimize the effect of the error signals e(k/2) in accordance with the LMS-algorithm. The coefficient circuits obtain their starting values through the first channel estimate $\hat{H}F$ from the correlating and synchronizing circuit 15. These starting values are connected with the aid of the switch 44, which is controlled from the synchronizing circuit 24. The estimated signal values $\hat{y}(k/2)$ are generated with the aid of the estimated symbols $\hat{S}_D(k)$, which are delayed through the viterbi algorithm by a number q symbol times TS. The observed signal values y(k/2) are therefore delayed the number q symbol times in the delay circuit 32. By inserting the zero-value fictive symbols $\Omega$ between the estimated symbols $\hat{S}_D(k)$, the coefficient circuits 42 obtain a zero-value as input signal with each alternate updating. The circuits therefore need to be updated only once with each symbol time TS, which simplifies updating. This will be more apparent from the following description of the channel estimation method.

The estimated signal $\hat{y}(k/2)$ has two separate values for each symbol, firstly $\hat{y}(k)$ at the symbol sampling time point TO and secondly $\hat{y}(k-\frac{1}{2})$ one-half symbol time TS/2 earlier. These values are generated in accordance with the following:

$$\hat{y}(k-\frac{1}{2})=\hat{H}_0(k)\hat{S}_D(k)+\hat{H}_2(k)\hat{S}_D \quad (k-1)$$

$$\hat{y}(k)=\hat{H}_1(k)\hat{S}_D(k)+\hat{H}_3(k)\hat{S}_D(k-1) \quad (1)$$

In FIG. 5, the symbol values of the symbol sequence $\hat{S}_D(k), \Omega$ at time position $k-\frac{1}{2}$ one-half symbol time TS/2 prior to the symbol sampling time TO are marked at the inputs of the coefficient circuits 42. One-half symbol time later, at symbol sampling time TO, the symbol values are shifted TS/2 to the right in the Figure. The error signals e(k/2) during a symbol time have two different values during the symbol time TS:

$$e(k-\frac{1}{2})=y(k-\frac{1}{2})-\hat{y}(k-\frac{1}{2})$$

$$e(k)=y(k)-\hat{y}(k) \quad (2)$$

where y (k) and y ($k-\frac{1}{2}$) are the two observed signal values during a symbol time of the observed signal y(k/2). The channel estimate is updated in the case of the illustrated embodiment through the LMS-algorithm according to the relationships:

$$\begin{bmatrix} \hat{H}_0(k) \\ \hat{H}_1(k) \\ \hat{H}_2(k) \\ \hat{H}_3(k) \end{bmatrix} = \begin{bmatrix} \hat{H}_0(k-1) \\ \hat{H}_1(k-1) \\ \hat{H}_2(k-1) \\ \hat{H}_3(k-1) \end{bmatrix} + \mu \begin{bmatrix} \hat{S}_D(k) \\ 0 \\ \hat{S}_D(k-1) \\ 0 \end{bmatrix} e(k) \quad (3)$$

$$\begin{bmatrix} \hat{H}_0(k) \\ \hat{H}_1(k) \\ \hat{H}_2(k) \\ \hat{H}_3(k) \end{bmatrix} = \begin{bmatrix} \hat{H}_0(k-1) \\ \hat{H}_1(k-1) \\ \hat{H}_2(k-1) \\ \hat{H}_3(k-1) \end{bmatrix} + \mu \begin{bmatrix} 0 \\ \hat{S}_D(k) \\ 0 \\ \hat{S}_D(k-1) \end{bmatrix} e(k-1/2)$$

In the above list of relationships, $\mu$ is a parameter, the step length, in the adaptation algorithm. It will be seen from the relationship (3) that the values of the coefficient circuits 42 need only be calculated once with each symbol time, as a result of inserting the zero-value fictive symbols $\Omega$. It will also be seen from the relationship (1), generation of the estimated signals $\hat{y}(k/2)$ is also simplified by the insertion of the zero-value fictive symbol $\Omega$. Each of the relationships (1) has only two terms instead of the four terms that would be required if values other than zero-values were inserted between the estimated symbols $\hat{S}_D(k)$ and $\hat{S}_D(k-1)$. The RLS-algorithm (Recursive Least Square) or the Kalman-algorithm are examples of alternatives to the LMS-algorithm.

Figure 6:
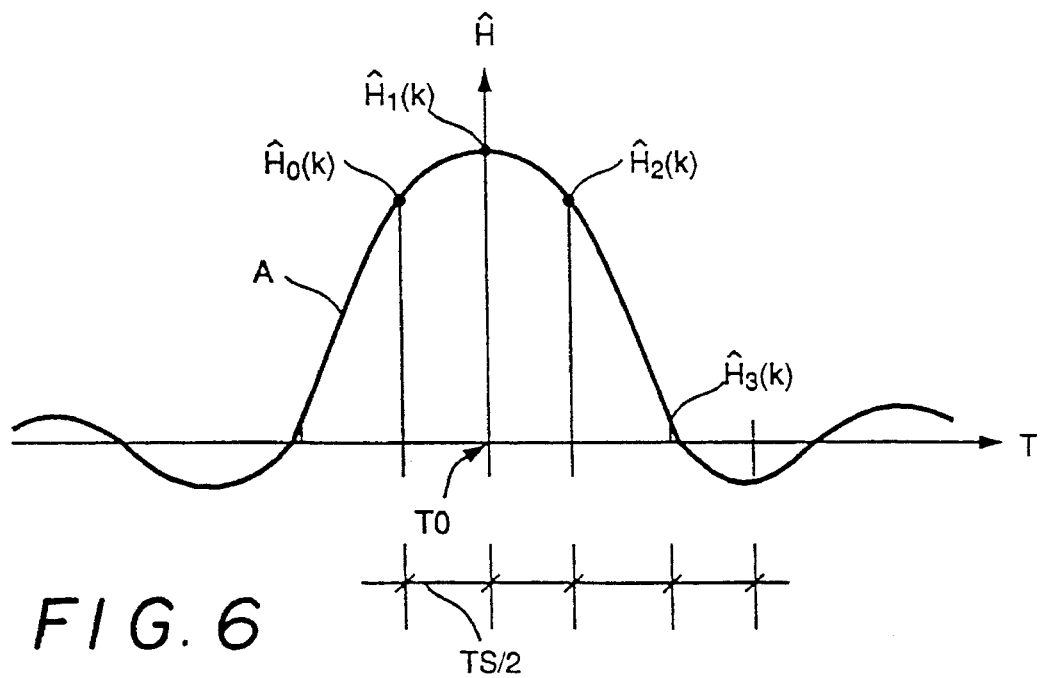
FIG. 6 is a diagrammatic illustration of a radio channel impulse response.

An example of the possible configuration of the channel estimate is shown in FIG. 6, which is a diagram in which the coordinate axes denote with the time T and the channel estimate amplitude $\hat{H}$. A curve A shows a continuous impulse response for the channel 13 and the discrete values $\hat{H}_0(k)$, $\hat{H}_1(k)$, $\hat{H}_2(k)$ and $\hat{H}_3(k)$ for the channel estimate are shown at the selected time points at the time spacing TO. The Figure shows the symbol sampling time TO, and the symbol counter k indicates that the discrete channel estimate values relate to the time index k.

The prefilter function $\hat{G}(k/2)$ can be said generally to be a function of the channel estimate ($\hat{H}(k/2)$) and the weighting factors $\alpha(k/2)$. The optimal setting of the prefilter is a filter matched to the radio channel, provided that the number of coefficients in the channel estimate and the prefilter is sufficiently large. As before mentioned, the use of such long channel estimates is encumbered with drawbacks. One of the more significant advantages that can be achieved with the present invention is that the channel estimate and the prefilter can be made very short. This is made possible by the insertion of the weighting factors $\alpha(k/2)$. According to the illustrated embodiment, the prefilter function $\hat{G}(k/2)$ has four coefficients, which are generated in the filter generator 38 according to the relationships:

$$\hat{G}_0(k) = \alpha_k \cdot \hat{H}_3{}^*(k)$$
$$\hat{G}_1(k) = \alpha_{k-\frac{1}{2}} \cdot \hat{H}_2{}^*(k)$$
$$\hat{G}_2(k) = \alpha_k \cdot \hat{H}_1{}^*(k)$$
$$\hat{G}_3(k) = \alpha_{k-\frac{1}{2}} \cdot \hat{H}_0{}^*(k)$$
(4)

The coefficient values in the channel estimate $\hat{H}(k/2)$ are complex conjugated as indicated by the symbol *, and arranged in reverse time order, as shown by the order of the indexes 0, 1, 2, 3, and are multiplied by the weight factors $\alpha(k/2)$. It is assumed in the relationships (4) that the prediction circuit 38A is disconnected, so that the channel estimate $\hat{H}(k/2)$ is used directly when generating the prefilter function $\hat{G}(k/2)$.

The filter generator 38 delivers the coefficients in the relationship (4) to the prefilter 26, as shown in FIG. 7. The prefilter includes delay circuits 261, coefficient circuits 262 and summators 263. The delay circuits are connected sequentially in series and delay the incoming, observed signal $y(k/2)$ successively by one-half symbol time TS/2. The delayed signals are multiplied in the coefficient circuits 262 by the coefficient values in accordance with the relationship (4) and are added in the adders 263. The resultant summation signal is sampled once for each symbol time TS, so as to obtain the prefiltered signal $z(k)$.

According to one alternative, the prediction circuit 38A is used so that the predicted values of the channel estimate are utilized when generating the prefilter function $\hat{G}(k/2)$. This is significant when effecting the metric calculation in the channel equalizer 17, where the channel estimate coefficients vary with time. As will be apparent from the relationships 4, the coefficients in the channel estimate $\hat{H}(k/2)$ are used in the reverse order when generating the prefilter function $\hat{G}(k/2)$. Thus, in the case of the illustrated embodiment, a signal value of the signal $y(k/2)$ at time point k will be multiplied by a coefficient value in the first coefficient of the prefilter that applies for the time point k−1. This can result in some impairment of the symbol estimation in the case of highly pronounced time dispersion of the channel 13. This is counteracted by predicting with prediction times of the prefilter coefficients of mutually different durations, the longest prediction time for the first coefficient of the prefilter and successively decreasing prediction times for the following coefficients. Prediction in the circuit 38A results in predicted coefficient values in the prefilter function $\hat{G}(k/2)$ which are instantaneous with the signal values $y(k/2)$. Reference is made to a dissertation submitted to the Kungl. Tekniska Högskolan (The Royal Institute of Technology) in Stockholm by Erik Dahlman: "A Study of Adaptive Detectors for Fast-Varying Mobile-Radio Channels", Oct. 19, 1992, Report No. TRITA-TTT-9102, Section 3, "Improved Channel Estimates Using Prediction", for a more comprehensive description of prediction methods.

The coefficients of the filter function $\hat{W}(k)$ are used for performing the metric calculation in the channel equalizer 17, these coefficients being generated in the metric calculation filter 39. The filter function is generated as a convolution of the channel estimate $\hat{H}(k/2)$ with the prefilter function $\hat{G}(k/2)$, $\hat{H}(k/2) \times \hat{G}(k/2)$, where the symbol x signifies the convoluting operation. The result of this convolution is sampled at symbol rate with a starting point from the symbol sampling time point, as indicated by the reference TO in FIG. 4. This sampling is effected in a known manner, with the aid of a sampling unit not shown.

The channel equalizer 17 works in accordance with a so-called symbol sampled viterbi algorithm, since it channel-equalizes the signal $z(k)$ which is sampled at symbol rate. Reference is made to the aforesaid reference "The Viterbi Algorithm" by G. Forney for a more detailed description of the viterbi algorithm. The algorithm has, in a known manner, a number of states $N=M^L$, where M signifies the number of values that a symbol may have and L is the memory length of the filter function $\hat{W}(k)$ in the number of symbol times TS. In the illustrated embodiment, M=4 according to FIG. 3 and, after convolution, the memory length of the filter function $\hat{W}(k)$ has been chosen as L=1, so that the equalizer 17 will have N=4 number of states. It can be said generally that the viterbi algorithm compares sequences of the observed, prefiltered signals $z(k)$ with hypothetical sequences that are generated with the aid of the hypothetical symbols $\hat{S}(k)$ and with the aid of the coefficients of the filter function $\hat{W}(k)$. The hypothetical symbols are given by the set:

$$\hat{S}(k) = (+e, cir\ S+ee_0(k), +e, cir\ S+ee_1(k), +e, cir\ S+ee_2(k), +e, cir\ S+ee_3(k)) \quad (5)$$

The comparison between the two sequences results in deviation values, called metric values, which are calculated stepwise, by adding the delta metric values. As before mentioned, the generation of delta metric values in accordance with the present invention is a simplified non-quadratic process and is carried out in the manner described in the aforesaid reference "Adaptive Maximum-Likelihood Receiver for Carrier-Modulated Data-Transmission Systems" by G. Ungerboeck. The delta metric values are calculated for different transitions between the states of the viterbi algorithm. The largest metric value is chosen for each step in the generation of the metric value and corresponding transitions are noted. Generation of the metric values is interrupted after a predetermined number of calculation steps and a symbol is chosen, such as the estimated symbol $\hat{S}_D(k)$ on the basis of the metric value obtained. It will also be noted that in the simplified viterbi algorithm, the largest metric value is chosen for each state as distinct from what is the case with typically used variants of the viterbi algorithm. The simplification resulting from the use of non-quadratic metric calculations affords important advantages in practice in symbol estimation, because quadration or squaring of the values obtained is avoided.

As before mentioned, the estimated symbols $\hat{S}_D(k)$ are delayed by a number q symbol times in relation to the received signal $y(k/2)$. This results in a delay in adaptation of the channel estimation filter 31. In order to reduce this harmful delay, there is used in accordance with one inventive alternative preliminary estimated symbols $\hat{S}_p(k)$ from the channel equalizer 17 in the adaptation process. The preliminary symbols $\hat{S}_p(k)$ are decided after a fewer number of steps than the final symbols $\hat{S}_D(k)$ in the equalizer 17 and are produced with a smaller delay than the aforesaid q symbol times, as indicated in FIG. 4.

According to one advantageous embodiment of the invention, the aforesaid weight factors $\alpha(k/2)=(\alpha_{k-\frac{1}{2}}, \alpha_k)$ are generated with the aid of the error signals $e(k)$ and $e(_{k-\frac{1}{2}})$. This generation of the weight factors is based on the observation that the statistic expected values of the respective squares of the error signals represent a total noise disturbance level, residual intersymbol interference and co-channel interference. The greater the expected value, the less the correspondence between the estimated signal values $\hat{y}(k-\frac{1}{2})$ and $\hat{y}(k)$ and their respective observed signals $y(k-\frac{1}{2})$ and $y(k)$. It follows from this that also the corresponding delta metric values will correspond less accurately to the error caused by noise on the channel. These delta metric values shall then be weighted down in the viterbi algorithm, since the values are uncertain. It may be that one expected value, or actually the statistic variance, is ten times greater than the other, particularly in the case of short channel estimates. The corresponding error signal will then probably contain a large amount of unknown intersymbol interference rather than channel noise and is therefore uncertain. The powers of the two error signals $e(k)$ and $e(k-\frac{1}{2})$ will differ greatly from one another, as before mentioned, particularly when the channel estimate $\hat{H}(k/2)$ has few coefficients. A good symbol estimation can be made by utilizing the weight factors $\alpha(k/2)$, even when the channel estimate has few coefficients. This is one of the fundamental advantages afforded by the present invention. It will be understood, however, that embodiments which include relatively long channel estimates also lie within the scope of the invention. In this case, symbol estimation requires more calculation, but generation of the weighting factors is simplified and these factors can be adjusted to $\alpha(k/2)=1$, or they could at least be made the same for all taps. In the case of these latter embodiments of the invention, it remains to generate the prefilter with the aid of the channel estimate, so as to avoid the problems of stability and quickness in symbol estimation, mentioned in the introduction.

The statistical expected values are estimated by squaring the values of the error signals and forming mean values. The expected values and the weight factors are generated in the circuit 35, which is shown in more detail in FIG. 8. The circuit includes two quadrators 51 and 52, two lowpass filters 53 and 54, two inverters 55 and 56 and two signal switches 57 and 58. The signal switch 57 receives the error signals $e(k/2)$ and delivers these signals alternately to the quadrators 51 and 52 at one-half symbol time TS/2 intervals. The signal switch 57 is controlled in a manner not more closely shown by signals from the synchronizing circuit 24 in FIG. 4. The two error signals $e(k-\frac{1}{2})$ and $e(k)$ are squared in their respective quadrators 51 and 52 and mean values are formed from the squared values by filtering said values in their respective lowpass filter 53 and 54. These filters deliver signals $\sigma^2(k-\frac{1}{2})$ and $\sigma^2(k)$ respectively which correspond to the aforesaid statistical expected values of the error signals. The signals $\sigma^2(k-\frac{1}{2})$ and $\sigma^2(k)$ are inverted in respective inverters 55 and 56 to provide the aforesaid weight factors $\alpha_k$ and $\alpha_{k-\frac{1}{2}}$ and are delivered to the signal switch 58. The signal switch is controlled from the synchronizing circuit 24, in a manner not shown in detail, and applies the weight factors to the filter generator 38 at intervals of one-half symbol time TS/2. The circuit 35 shown in FIG. 4 thus generates weight factors in accordance with the following relationship:

$$\alpha_{k-\frac{1}{2}}=1/|\overline{e}(k-\frac{1}{2})|^2$$

$$\alpha_k=1/|\overline{e}(k)|^2 \qquad (6)$$

where the horizontal lines above $|\overline{e}(k-\frac{1}{2})|$ and $|\overline{e}(k)|$ the formation of mean values.

According to one alternative, attention is also paid to the values of the filter coefficients in the channel estimate when generating the weight factors according to the following relationship:

$$\alpha_{k-\frac{1}{2}}=(\hat{H}_0^2+\hat{H}_2^2)/\sigma^2(k-\frac{1}{2})$$

$$\alpha_k=(\hat{H}_1^2+\hat{H}_3^2)/\sigma^2(k) \qquad (7)$$

In order to generate these alternative weight factors, the circuit 35 receives the channel estimate $\hat{H}(k/2)$ from the channel estimation circuit 31, via a connection 35A shown in broken lines in FIG. 4. The filter coefficients $\hat{H}_0$ and $\hat{H}_2$ and $\hat{H}_1$ and $\hat{H}_3$ are squared and added in pairs in the circuits 59 and 60, which are included in the quadrating and mean value-forming circuit 35, and are multiplied by the inverted values of $\sigma^2(k-\frac{1}{2})$ and $\sigma^2(k)$ respectively. The thus generated weight factors $\alpha(k/2)$ are delivered to the filter generator 38 and used in generating the prefilter function $\hat{G}(k/2)$, as described above with reference to the relationships (4). According to another alternative method of generating the weight factors, there is used a more direct measurement of the received signal strength in the numerator of the relationships (7). This measurement is the so-called RSSI-value (Received Signal Strength Indicator) which is mainly a squared and lowpass-filtered value of the absolute value of the received signal $y(k/2)$. This RSSI-value is generated in a circuit 35B, shown in broken lines in FIG. 4.

The embodiment above comprises adapting the channel estimate $\hat{H}(k/2)$ with the aid of the decided or preliminarily decided symbols. According to a simplified alternative, the values of the filter coefficients are adjusted in the channel estimation circuit 31 only once with each symbol sequence SS, with the aid of the first channel estimate $\hat{H}F$. This means that the circuit 34 with the adaptation algorithm is excluded. In this respect, the symbol sequence containing alternately estimated symbols $\hat{S}_D(k)$ and fictive zero-value symbols $\Omega$ delivered to the channel estimation circuit 31 are used solely to generate the estimated signal $\hat{y}(k/2)$. However, according to the simplified alternative, the insertion of the zero-value fictive symbols $\Omega$ are significant to the generation of error signals $e(k/2)$, which according to the relationships (1) and (2) are generated with the aid of the estimated signals $\hat{S}_D(k)$.

Figure 9:
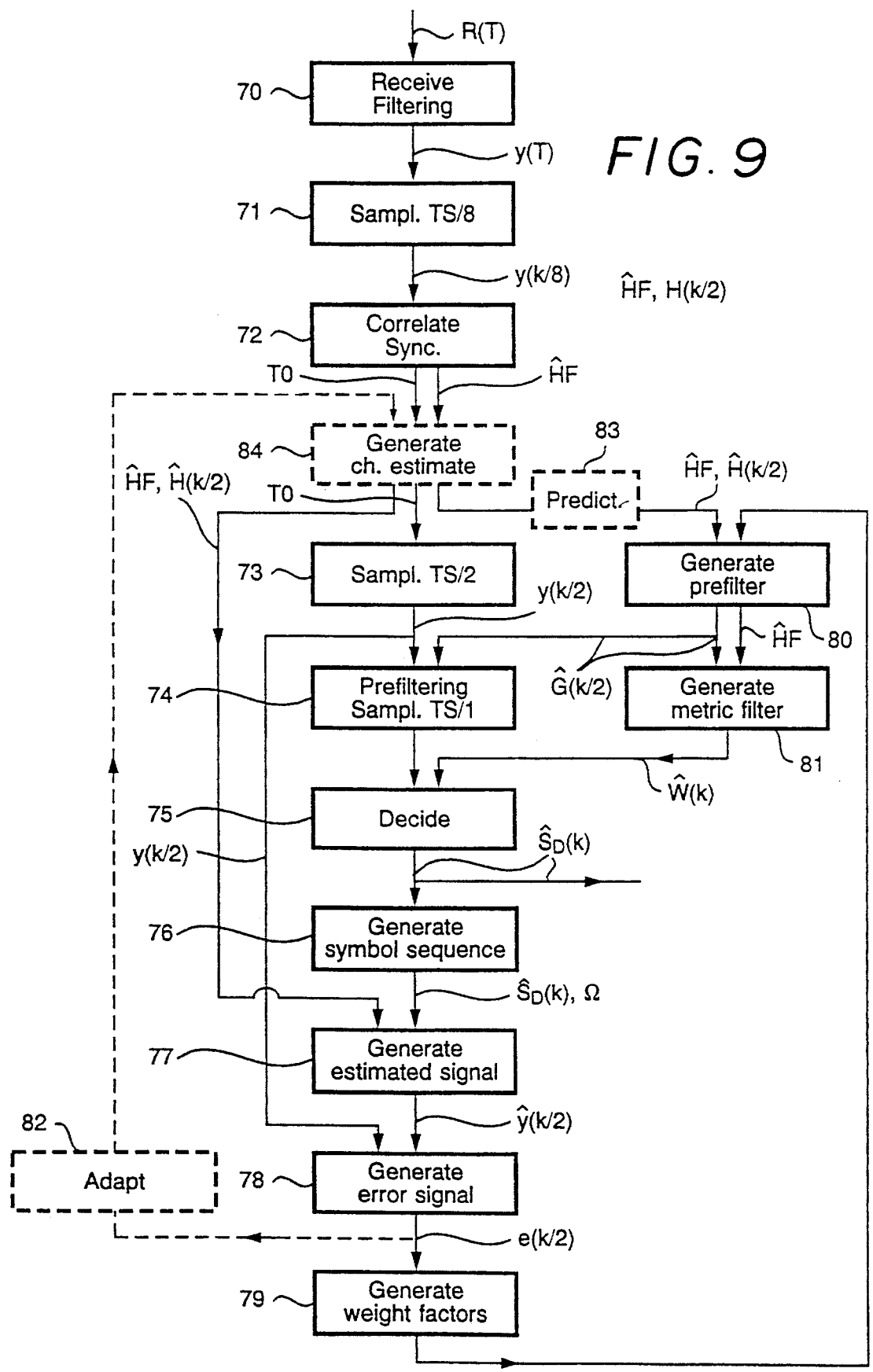
FIG. 9 is a flowsheet illustrating the inventive method.

The inventive method is outlined in the flowsheet presented in FIG. 9. The radio signal $R(T)$ is received in a block 70, mixed down and filtered to a baseband signal $y(T)$. This signal is sampled eight times per symbol time TS according to block 71, and the sampled signal $y(k/8)$ is used for correlation, block 72. This correlation gives the sampled impulse response of the channel, including the radio channel 13, which is used to determine the channel estimate $\hat{H}F$ and to determine the symbol sampling time TO. The once sampled signal $y(k/8)$ is down-sampled on the basis of this time point TO according to block 73, to obtain the observed signal $y(k/2)$, which has two signal values per symbol time TS. The signal $y(k/2)$ is prefiltered in block 74 and down-sampled to symbol rate, so as to obtain the prefiltered signal $z(k)$. According to block 75, the estimated symbols $\hat{S}_D(k)$ are decided in the channel equalizer, and according to block 76, the symbol sequence of these estimated symbols and the fictive zero-value symbols $\Omega$ is generated. The estimated signal values $\hat{y}(k/2)$ are generated in block 77 with the aid of the channel estimate $\hat{H}F$ and the aforesaid signal sequence. The error signals $e(k/2)$ are generated with the aid of these estimated signal values and the observed signal values $y(k/2)$ according to block 78. The weight factors α(k/2) are generated in block 79 by squaring, lowpass filtering and inverting the error signals. According to block 80, the weight factors α(k/2) and the channel estimate ĤF are used to generate the prefilter coefficients. These coefficients are used when prefiltering according to block 74 and also to generate the metric filter according to block 81. The coefficients in the metric filter Ŵ(k) are used to decide the symbols $\hat{S}_D(k)$.

The flow schematic in FIG. 9 illustrates a simple embodiment of the invention, for the sake of clarity in full lines. Also shown in the flow schematic, in broken lines, is the block 84 according to which the channel estimate (Ĥ(k/2) is generated and shows how this channel estimate according to block 82 is adapted with the aid of the error signal e(k/2). Prediction of the channel estimate coefficients prior to generating the prefilter is shown with a block 83.

In the above embodiment, the observed sampled signal y(k/2) has two signal values per symbol time TS. It lies within the scope of the invention to choose, for instance, four or still more signal values per symbol time. This requires, however, that the channel estimation filter 31 has correspondingly more coefficient circuits 42. According to this example, the channel estimate Ĥ(k/2) extends over one symbol time, but may be broader. This also requires the channel estimation filter 31 to have more coefficient circuits 42, which results in a larger adaptation delay. The preliminarily decided symbols $\hat{S}_P(k)$ can be used with the intention of reducing the delay when adapting the channel estimate Ĥ(k/2) and generating the weight factors α(k/2). It is also fully possible to have a relatively long channel estimation filter and therewith a long prefilter without extending the metric calculation filter, as this filter can be truncated. This enables the number of states in the viterbi analyzer 17 that are dependent on the length of the metric calculation filter to be limited, despite the channel estimate being long.

Figure 10:
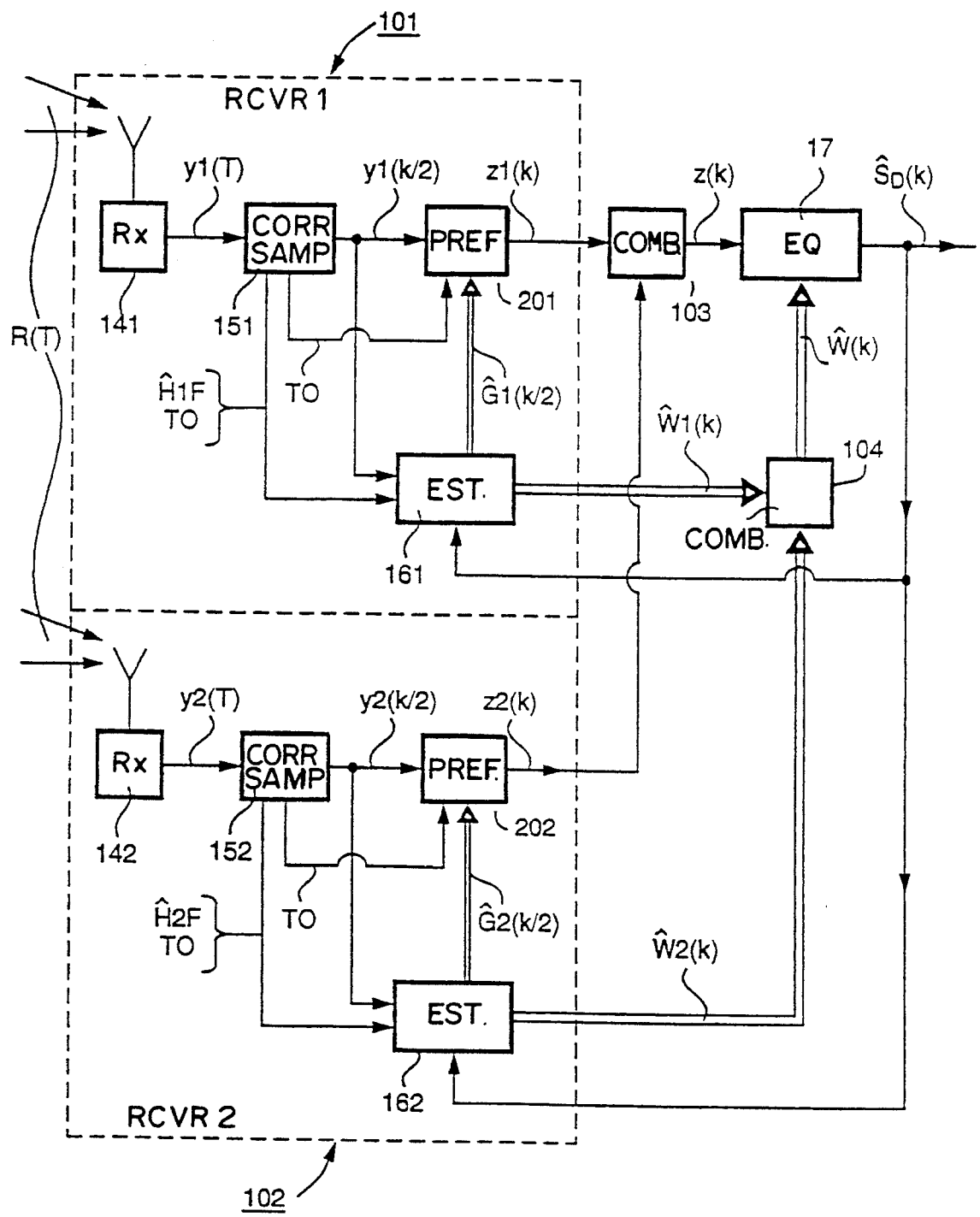
FIG. 10 is a block schematic illustrating an alternative embodiment of the invention.

An alternative embodiment of the invention will now be described with reference to FIG. 10. The embodiment comprises essentially a receiver having antenna diversity, in which the received signal R(T) is processed as described above in two separate receiver circuits 101 and 102, which form two separate diversity branches. Output signals from these circuits are combined and processed in the channel equalizer 17. Each of the two circuits 101 and 102 includes a respective radio receiver 141 and 142 which receives the signal R(T) on its respective antenna. Each of the radio receivers delivers a respective baseband signal y1(T) and y2(T) to its respective correlating and sampling circuit 151 and 152. In addition to generating the symbol sampling time point TO, each of these circuits also generates a respective first channel estimate ĤF and Ĥ2F, and a respective observed sampled signal y1(k/2) and y2(k/2). These signals are prefiltered in prefilter circuits 201 and 202 to obtain prefiltered, observed signals z1(k) and z2 (k) respectively. Each of the receiver circuits 101 and 102 has a respective channel estimation circuit 161 and 162 which each generate a respective prefilter function Ĝ1(k/2) and Ĝ2 (k/2) and a respective filter function Ŵ1(k) and Ŵ2 (k) for metric calculation. Each of the channel estimation circuits 161 and 162 receives its respective channel estimate values and sampling time points, delivers the prefilter functions Ĝ1(k/2) and Ĝ2(k/2) to a respective prefilter 201 and 202, and produces the filter functions Ŵ1(k) and Ŵ2(k). These are combined in a circuit 104 to form the filter function Ŵ(k) and the prefilter, observed signals z1(k) and z2(k) are combined in a circuit 103 to form the common, prefiltered signal z(k). Combination of both the filter functions Ŵ1(k) and Ŵ2(k) and the prefiltered, observed signals z1(k) and z2(k) can be effected by addition. The channel equalizer 17 generates the estimated symbols $\hat{S}_D(k)$ with the aid of the prefiltered signal z(k) and the filter function Ŵ(k) through its viterbi algorithm with non-quadratic metric calculation. The channel estimation circuits 161 and 162 are adapted with the aid of the estimated symbols $\hat{S}_D(k)$.

It will be observed that in the case of the embodiment having antenna diversity, the different diversity branches 101 and 102 have, in the majority of cases, different symbol sampling time points, even though these time points have been referenced TO in common. Weight factors can be calculated in the same manner as that in the embodiment described with reference to FIGS. 4–9, these weight factors being generally different in the different diversity branches. When adapting the channel estimate, there can be used a zero sequence of the zero-value symbols Ω and this symbol sequence will be the same for both diversity branches, since only one array of the estimated symbols $\hat{S}_D(k)$ is generated.

Figure 11:
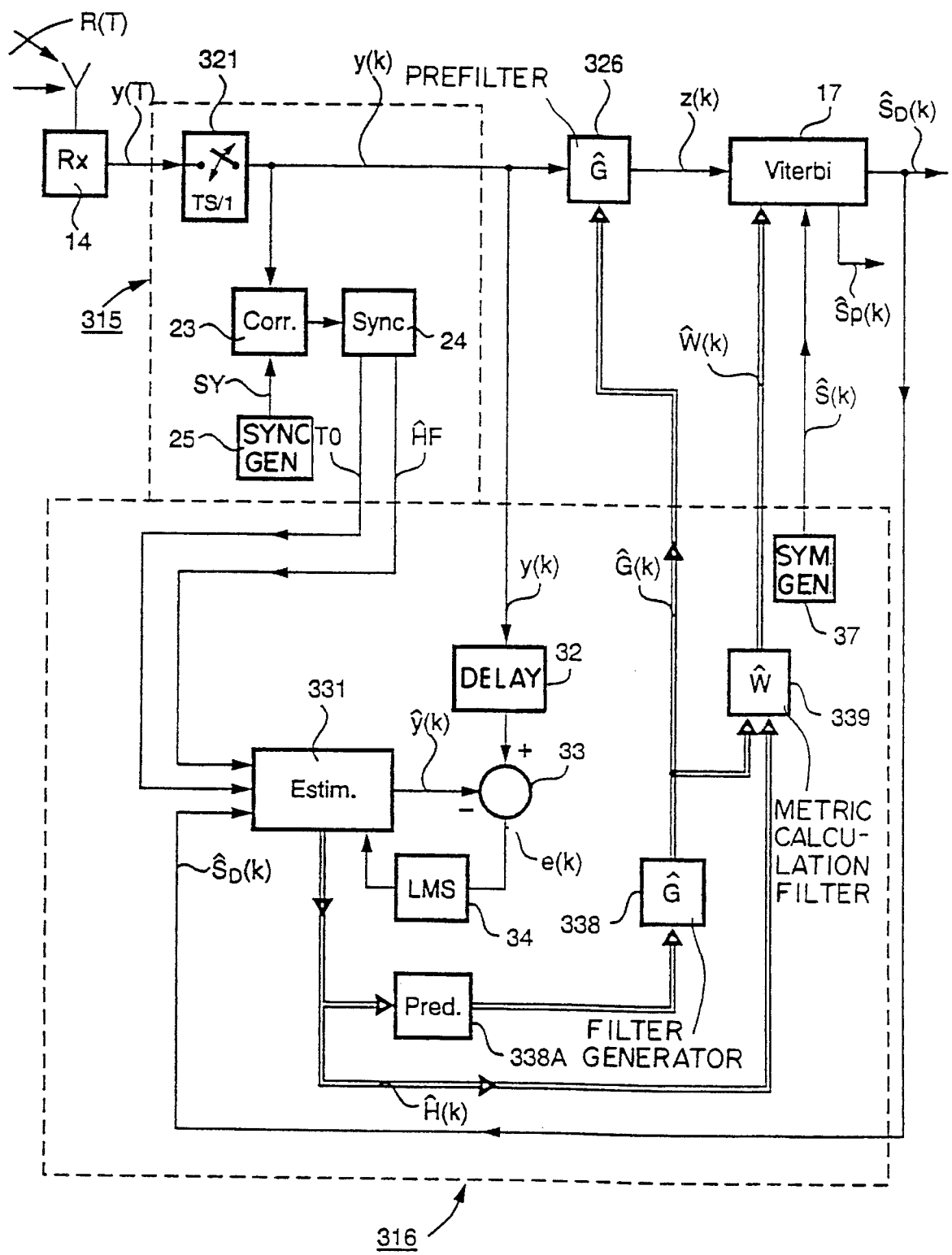
FIG. 11 is a block schematic illustrating a further embodiment of the invention.

Still another alternative embodiment of the invention will be described with reference to FIG. 11. This embodiment can be used when the channel varies rapidly but the signal bandwidth B of the system is beneath the symbol rate R, so that the problem of "excess bandwidth" does not exist. The radio receiver 14 is connected to a correlating and sampling unit 315, which includes a sampling unit 321, correlating circuit 23, the synchronizing circuit 24 and the generator 25 for the synchronizing sequence SY. The sampling unit 321 receives the baseband signal y(T) and samples this signal at symbol rate TS/1 and delivers the observed sampled signal y(k) to the correlating circuit 23. This circuit generates the first channel estimate ĤF, which is delivered to the synchronizing circuit 24, which in turn delivers the channel estimate and the synchronizing time point TO to a channel estimation circuit 316.

The channel estimation circuit 316 includes an adaptive channel estimation filter 331, the delay circuit 32, the difference former 33, the adaptation circuit 34, the symbol generator 37, a filter generator 338 with a prediction circuit 338A and a metric calculation filter 339.

The correlating and sampling unit 315 delivers the observed signal y(k) to a prefilter 326, which delivers the observed, prefiltered signal z(k) to the channel equalizer 27. The channel equalizer produces the desired estimated symbols $\hat{S}_D(k)$.

The channel estimation filter 331 receives the first channel estimate ĤF, the symbol sampling time point TO and the estimated symbols $\hat{S}_D(k)$. The estimated signal values ŷ(k) are formed with the aid hereof and are delivered to the difference former 33. The difference former also receives the observed signal y(k) which has been delayed in the circuit 32, and produces an error signal e(k). The error signal is received by the adaptation circuit 34 which controls the channel estimation filter 331 through its algorithm, said filter delivering successively adapted values of the channel estimate Ĥ(k) to the filter generator 338, via the prediction circuit 338A. There is generated in the filter generator a prefilter function Ĝ(k), whose coefficients are delivered to the prefilter 326 and to the metric calculation filter 339. This filter also receives the channel estimate Ĥ(k) and generates through a convoluting operation the filter function Ŵ(k) whose coefficients are delivered to the channel equalizer 17.

Similar to preceding embodiments, the prediction circuit 338A can be excluded so as to simplify signal processing. The preliminarily estimated symbols $\hat{S}_P(k)$ can be used when generating the estimated signal values ŷ(k).

When seen against the background of the description of the embodiments illustrated in FIGS. 1 to 7, the person skilled in this art will readily understand the signal processing that takes place in the channel estimation circuit 316. This signal processing will not therefore be described in detail, and only those essential differences in relation to the preceding embodiment will be mentioned. In the FIG. 11 embodiment, signal processing takes place at symbol rate and the prefiltered signal is therefore not sampled down. The coefficients of the channel estimation filter 331 are mutually spaced by one symbol time and no correspondence to the fictive symbols Ω is generated. Only one error signal e(k) per symbol is generated and consequently no error signal weighting factors are generated. The coefficients of the filter generator 338 and the metric calculation filter 339 are mutually spaced at a distance of one symbol time. Similar to preceding embodiments, a characteristic feature is that the system impulse response for the channel, including transmitter filter and receiver filter, is estimated explicitly and that the prefilter and the metric calculation filter are thereafter generated on the basis of the channel estimate.

The above exemplifying embodiments of the invention have been described with reference to a time-shared radio communications system according to FIG. 2. However, it lies within the scope of the present invention for the signals to be transmitted in other formats than the described signal sequences SS. Thus, the invention can be applied to e.g. a solely frequency-divided system, in which one or more synchronizing sequences are transmitted together with the information to be conveyed.

In addition to radio communication, the invention can also be applied with digital communication within a network having fixed lines. Two subscribers can be connected together on different occasions through channels which include separate lines having different impulse responses. Similar to the aforedescribed radio communication embodiment, the receivers of respective subscribers are provided with a correlating circuit, prefilter circuit, channel equalizer, and channel estimation circuit of the same kind as that shown in FIG. 4. Correlation is effected with the aid of a transmitted synchronizing sequence and there is formed a channel estimate which is utilized to generate a prefilter and a metric calculation filter. The receivers are automatically adjusted to each line, by using the channel equalizer. The invention can thus be applied in every transmission system that uses an equalizer in its receiver.

As before mentioned, adaptation of the channel estimation filter 31 is simplified by inserting the fictive zero-value symbols Ω, and the adaptation delay is relatively small. In known techniques, for instance the technique according to the aforesaid article in IEEE by Yongbing Wan, et al, there are used interpolated symbol values between the estimated symbol values, such as fictive symbols. This results in a delay when adapting the channel estimate, which always impairs the final symbol estimation. One drawback with the technique disclosed in the article is that the filters in the transmission chain, transmitter and receiver filters, must be known to a high degree of accuracy, which is not the case when the zero-value symbols (Ω) are used. Another drawback is that the complexity of the receiver increases. The inventive generation of the prefilter function $\hat{G}(k/2)$ with the aid of the channel estimate $\hat{H}(k/2)$ and the weight factors $\alpha(k/2)$ provides important advantages. The simplified, non-quadratic metric calculation can be used advantageously in the viterbi analysis in the channel equalizer 17, which is highly significant to effecting symbol estimation in practice. The channel estimate can be allowed to have relatively few coefficients and the viterbi algorithm in the equalizer 17 has a correspondingly small number of states. In the case of fast varying channels, for instance with fading, the channel estimate $\hat{H}(k/2)$, the prefilter $\hat{G}(k/2)$ and the metric calculation filter $\hat{W}(k/2)$ remain stable without needing to introduce harmful restrictions on the adaptation of the channel estimate.

What is claimed is:

1. In a method of receiving successive digital symbols transmitted over a communication channel that uses a viterbi algorithm, a method of estimating transmitted symbols comprising the steps of:

(a) sampling a received signal at a sampling time point during each received symbol;

(b) correlating the samples generated by step (a) with a predetermined sequence to produce at least an initial estimated impulse response of the communication channel;

(c) generating coefficients of a prefilter based on an adapted estimated impulse response and prefiltering the samples;

(d) generating coefficients of a metric calculation filter based on the coefficients of the prefilter and the adapted estimated impulse response;

(e) generating at least preliminary estimated symbols using the viterbi algorithm and the prefiltered samples and the coefficients of the metric calculation filter;

(f) generating estimated signal values based on the estimate impulse response and the at least preliminary estimated symbols;

(g) generating error signal according to differences between the samples generated by step (a) and the estimate signal values; and (h) generating the adapted estimated impulse response based on the at least preliminary estimated symbols and the error signals.

2. The method of claim 1, wherein step (d) includes the step of convolving the estimated impulse response with the coefficients of the prefilter.

3. The method of claim 1, wherein step (e) includes the following steps:

(a) sampling the prefiltered samples at symbol rate;

(b) sampling the coefficients of the metric calculation filter at symbol rate; and (c) performing the preliminary symbol estimation at symbol rate.

4. In a method of receiving successive digital symbols transmitted over a communication channel that uses a viterbi algorithm, a method of estimating transmitted symbols comprising the steps of:

(a) sampling a received signal at a recurrent plurality of time points during each received symbol;

(b) designating one of the plurality of time points as a symbol sampling time point;

(c) selecting at least two samples for each received symbol, the selected samples being generated at the symbol sampling point and at least one other time point;

(d) correlating the samples generated by step (a) with a predetermined sequence to produce at least an initial estimated impulse response of the communication channel;

(e) generating coefficients of a prefilter based on the estimated impulse response and weight factor corresponding to the symbol sampling time point and the at least one other time point, and prefiltering the selected samples;

(f) generating coefficients of a metric calculation filter based on the estimated impulse response and the coefficients of the prefilter; and (g) generating at least preliminary estimated symbols according to the viterbi algorithm using the prefiltered samples and the coefficients of the metric calculation filter.

5. The method of claim 4, wherein the step of generating coefficients of a prefilter based on the estimated impulse response and the weight factors includes the steps of:

(a) generating complex conjugated values of the estimated impulse response;

(b) reordering the complex conjugated values in a reverse time order; and (c) multiplying the reordered complex conjugated values by the weight factors.

6. The method of claim 4, further comprising the steps of:

(a) generating estimated signal values corresponding to the symbol sampling time points and the other time points based on the estimated impulse response and the at least preliminary estimated symbols and intermediate fictive symbols; and (b) generating error signals according to differences between the selected samples of the received signal and the estimated signal values, wherein the weight factors are generated based on the error signals.

7. The method of claim 6, wherein the estimated impulse response of the channel is adapted at least once using the preliminary estimated symbols and the error signals, according to a selected adaptation algorithm.

8. The method of claim 6, wherein the weight factors are generated by squaring, lowpass filtering and inverting the error signals.

9. The method of claim 8, wherein the weight factors are generated by squaring and lowpass filtering the selected samples and multiplying the squared, lowpass-filtered selected samples by the squared, lowpass-filtered and inverted error signals.

10. The method of claim 8, wherein the weight factors are generated by squaring and adding coefficient values of the estimated impulse response and multiplying the squared, added coefficient values of the estimated impulse response and the squared, lowpass-filtered and inverted error signals to form the weight factors.

11. The method of claim 6, wherein the intermediate fictive symbols are zero-value symbols.

12. The method of claim 4, further comprising a step of adapting the estimated impulse response by:

(a) generating estimated signal values corresponding to the symbol sampling time points and the other time points based on the estimated impulse response and the at least preliminary estimated symbols and intermediate fictive symbols;

(b) generating error signals according to difference between the selected samples of the received signal and the estimated signal values; and (c) adapting the estimated impulse response using the error signals, the preliminary estimated symbols, and a selected adaptation algorithm.

13. In a receiver of successive digital symbols transmitted over a communication channel that uses a viterbi algorithm, an apparatus for estimating transmitted symbols comprising:

means for sampling a received signal at a sampling time point during during each received symbol;

means for correlating the samples generated by the sampling means with a predetermined sequence to produce at least an initial estimated impulse response of the communication channel;

means for generating prefilter coefficients based on an adapted estimated impulse response and prefiltering the samples;

a metric calculation filter having coefficients based on the prefilter coefficients and the adapted estimated impulse response; and channel equalizer means for generating at least preliminary estimated symbols using the viterbi algorithm based on the prefiltered samples and the coefficients of the metric calculation filter;

means for generating estimated signal values based on the estimated impulse response and the preliminary estimated symbols;

means for generating error signal according to differences between the samples of the received signal and the estimated signal values; and means for generating the adapted estimated impulse response using the preliminary estimated symbols and the error signal, according to a chosen adaptation algorithm.

14. The arrangement of claim 13, wherein the metric calculation filter includes means for convolving the estimated impulse response with the prefilter coefficients.

15. In a receiver of successive digital symbols transmitted over a communication channel that uses a viterbi algorithm, an apparatus for estimating transmitted symbols comprising:

means for sampling a received signal at a recurrent plurality of time points during each received symbol;

means for designating one of the plurality of time points as a symbol sampling time point;

means, connected to the sampling means, for selecting at least two samples for each received symbol, the selected samples being the samples generated at the symbol sampling time point and at least one other time point;

means for correlating the samples generated by the sampling means with a predetermined sequence to produce at least an initial estimated impulse response of the communication channel;

means for generating coefficients of a prefilter based on the estimated impulse response and weight factors corresponding to the symbol sampling time point and the at least one other time point, and prefiltering the samples;

a metric calculation filter having coefficients based on the prefilter coefficients;

channel equalizer means for generating at least preliminary estimated symbols according to the viterbi algorithm based on the prefiltered samples and the coefficients of the metric calculation filter; and means for generating the weight factor for the corresponding selected samples.

16. The apparatus of claim 15, wherein the prefiltering means includes means for sampling prefiltered samples at symbol rate, and the metric calculation filter includes means for sampling the coefficients of the metric calculation filter at symbol rate.

17. The apparatus of claim 15, further comprising:

means for generating estimated signal values corresponding to the symbol sampling time points and the other time points based on the estimated impulse response and the at least preliminary estimated symbols and intermediate fictive symbols; and means for generating error signals according to difference between the selected samples of the received signal and the estimated signal values, wherein the weight factors are generated based on the error signals.

18. The apparatus of claim 17, further comprising means for successively adapting the estimated impulse response using the preliminary estimated symbols and the error signals, according to a chosen adaptation algorithm.

19. The apparatus of claim 17, wherein the weight factor generating means further comprises means for squaring, lowpass filtering, and inverting the error signals to produce the weight factors.

20. The apparatus of claim 17, further comprising means for squaring and adding coefficient values of the estimated impulse response and multiplying the squared, added coefficient values by the squared, lowpass-filtered and inverted error signals to produce the weight factors.

21. The apparatus of claim 15, further comprising means for adapting the estimated impulse response comprising:

means for generating estimated signal values corresponding to the symbol sampling time points and the other time points based on the estimated impulse response and the at least preliminary estimated symbols and intermediate fictive symbols;

means for generating error signal according to difference between the selected samples of the received signal and the estimated signal values; and means for adapting the estimated impulse response using the error signals, preliminary estimated symbols and a selected adaptation algorithm.

22. The apparatus of claim 21, wherein the intermediate fictive symbols are zero-value symbols.

* * * * *